(12) United States Patent
Lian et al.

(10) Patent No.: US 11,309,190 B2
(45) Date of Patent: Apr. 19, 2022

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Jian-Jou Lian, Tainan (TW); Chun-Neng Lin, Hsinchu County (TW); Chieh-Wei Chen, Taoyuan (TW); Tzu-Ang Chiang, I-lan (TW); Ming-Hsi Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/746,239

(22) Filed: Jan. 17, 2020

(65) Prior Publication Data

US 2021/0225660 A1 Jul. 22, 2021

(51) Int. Cl.
| | |
|---|---|
| *H01L 21/3213* | (2006.01) |
| *H01L 29/51* | (2006.01) |
| *H01L 29/66* | (2006.01) |
| *H01L 21/28* | (2006.01) |
| *C09K 13/00* | (2006.01) |
| *H01L 21/8234* | (2006.01) |
| *H01L 21/027* | (2006.01) |
| *H01L 21/762* | (2006.01) |

(52) U.S. Cl.
CPC ........ *H01L 21/32134* (2013.01); *C09K 13/00* (2013.01); *H01L 21/28079* (2013.01); *H01L 21/28088* (2013.01); *H01L 21/28097* (2013.01); *H01L 21/823437* (2013.01); *H01L 29/517* (2013.01); *H01L 29/66795* (2013.01); *H01L 21/0276* (2013.01); *H01L 21/32139* (2013.01); *H01L 21/76224* (2013.01); *H01L 21/823431* (2013.01); *H01L 21/823481* (2013.01); *H01L 29/6656* (2013.01); *H01L 29/66545* (2013.01)

(58) Field of Classification Search
CPC ............. H01L 21/32134; H01L 29/517; H01L 29/66795; H01L 21/28079; H01L 21/28088; H01L 21/28097; H01L 21/823437; H01L 21/0276; H01L 29/66545; H01L 21/76224; H01L 21/823481; H01L 21/823431; H01L 29/6656; H01L 21/32139; C09K 13/00
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |

(Continued)

FOREIGN PATENT DOCUMENTS

| | | |
|---|---|---|
| KR | 20180060489 A | 6/2018 |

*Primary Examiner* — Shahed Ahmed
*Assistant Examiner* — Vicki B. Booker
(74) *Attorney, Agent, or Firm* — Slater Matsil, LLP

(57) ABSTRACT

In a wet etching process to pattern a metal layer such as a p-metal work function layer over a dielectric layer such as a high-k gate dielectric layer, a selectivity of the wet etching solution between the metal layer and the dielectric layer is increased utilizing an inhibitor. The inhibitor includes such inhibitors as a phosphoric acid, a carboxylic acid, an amino acid, or a hydroxyl group.

20 Claims, 11 Drawing Sheets

(56) References Cited

U.S. PATENT DOCUMENTS

| | | |
|---|---|---|
| 8,887,106 B2 | 11/2014 | Ho et al. |
| 9,831,088 B2 | 11/2017 | Chen et al. |
| 2014/0282326 A1 | 9/2014 | Chen et al. |
| 2016/0181163 A1* | 6/2016 | Huang ............ H01L 21/823857 257/369 |
| 2018/0148645 A1 | 5/2018 | Lee et al. |

* cited by examiner

US 11,309,190 B2

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
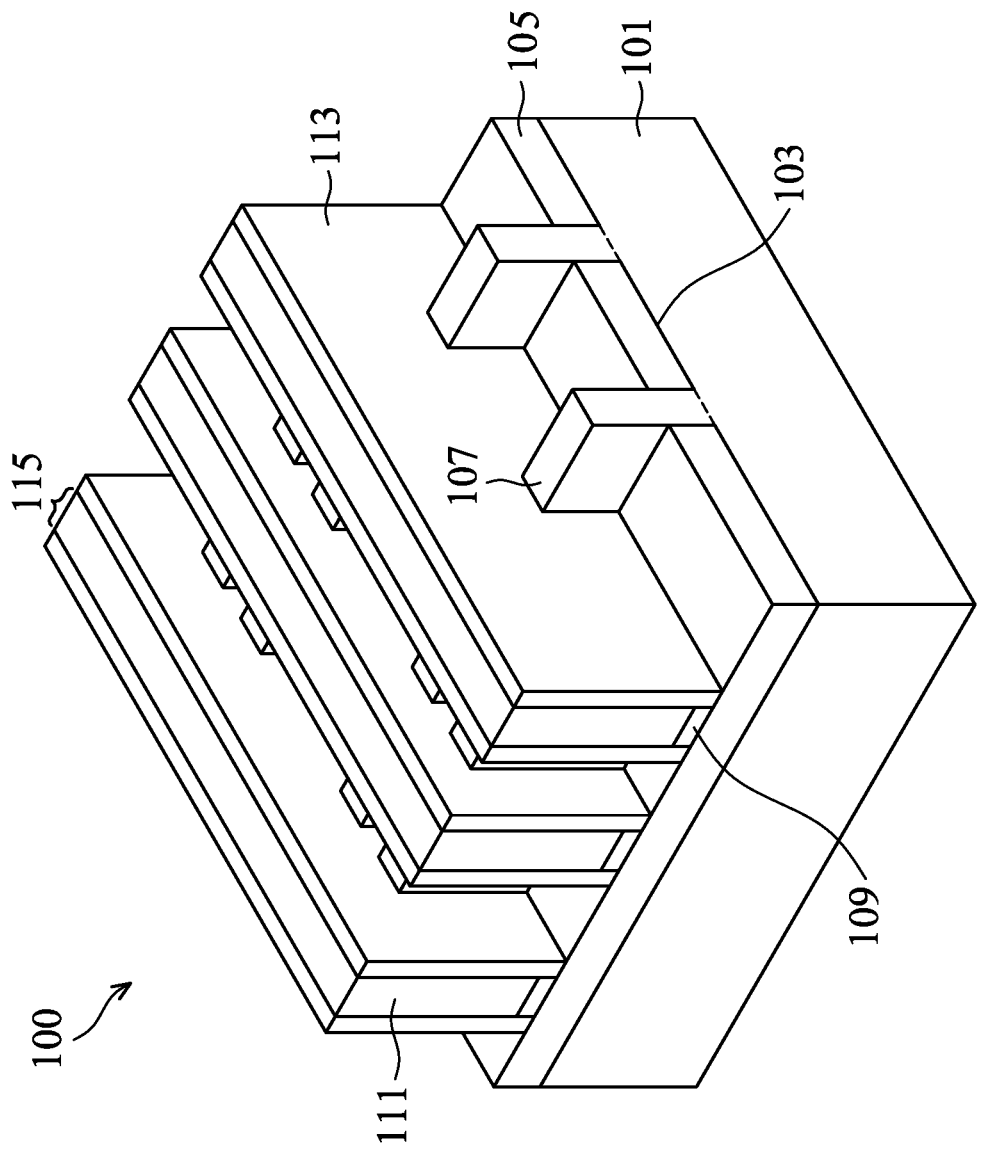
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET devices. However, embodiments are not limited to the examples provided herein, and the ideas may be implemented in a wide array of embodiments.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates four fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Optionally, although not illustrated in FIG. 1, in some embodiments a removal of the fins 107 from those areas not protected by the stacks 115 and the first spacers 113 and a regrowth of source/drain regions may be performed. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with or below the surface of the first isolation regions 105.

Once these portions of the fins 107 have been removed, a hard mask (not separately illustrated), is placed and patterned to cover the dummy gate electrode 111 to prevent growth and the source/drain regions may be regrown in contact with each of the fins 107. In an embodiment the source/drain regions may be regrown and, in some embodiments the source/drain regions may be regrown to form a stressor that will impart a stress to the channel regions of the fins 107 located underneath the stacks 115. In an embodiment wherein the fins 107 comprise silicon and the FinFET is a p-type device, the source/drain regions may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions may be formed to have a thickness of between about 5 Å and about 1000 Å and a height over the first isolation regions 105 of between about 10 Å and about 500 Å, such as about 200 Å. In this embodiment, the source/drain regions may be formed to have a height above the upper surface of the first isolation regions 105 of between about 5 nm and about 250 nm, such as about 100 nm. However, any suitable height may be utilized.

Once the source/drain regions are formed, dopants may be implanted into the source/drain regions by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions is removed. In an embodiment the hard mask may be removed using, e.g., a wet or dry etching process that is selective to the material of the hard mask. However, any suitable removal process may be utilized.

Figure 2A:
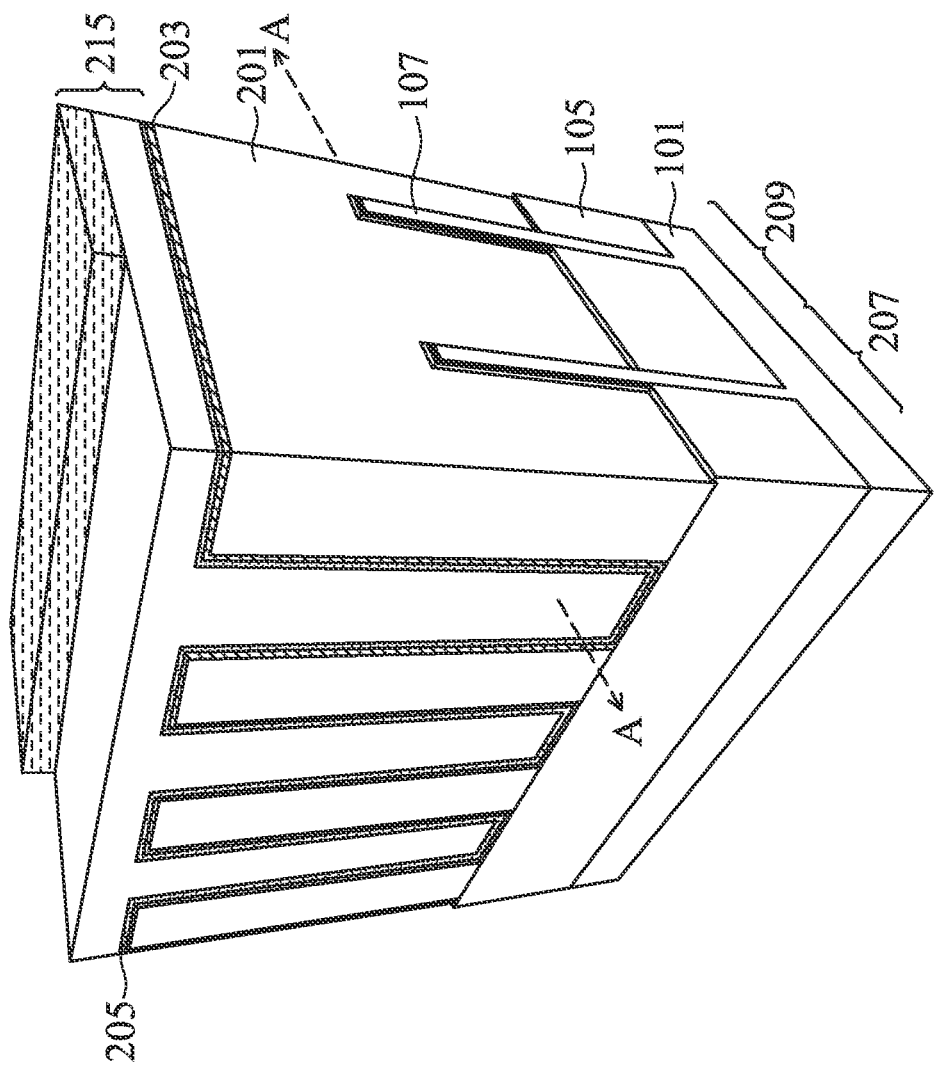
FIGS. 2A-2B illustrate formation of a high-k dielectric layer and first p-metal work function layer, in accordance with some embodiments.
Figure 2B:
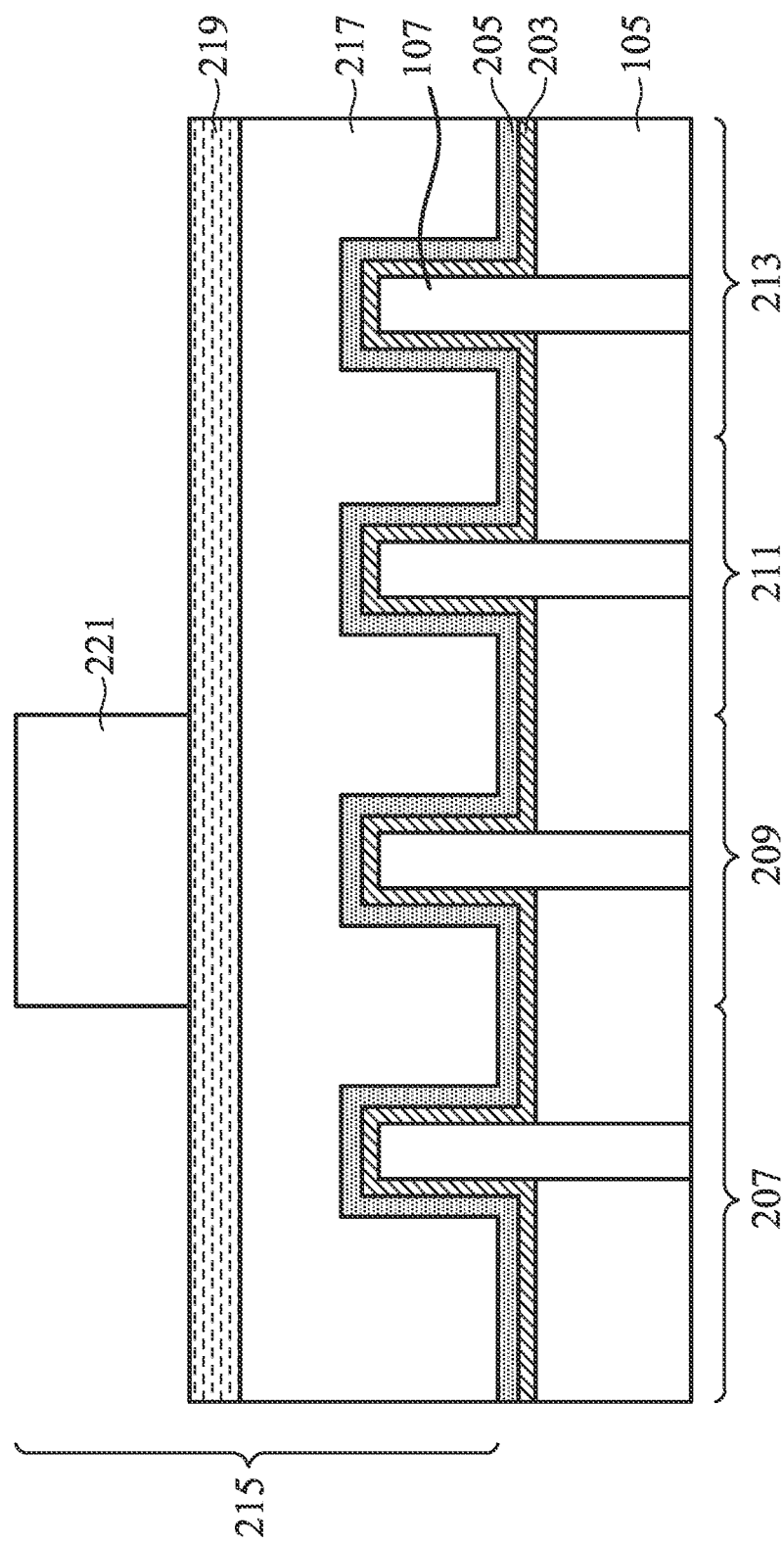

FIG. 2A illustrates a formation of an inter-layer dielectric (ILD) layer 201, with FIG. 2B illustrating a cross sectional view of FIG. 2A along cross-section A-A as illustrated in FIG. 2A, and with FIG. 2B illustrating two additional fins 107 in the cross sectional view. Additionally, while in FIG. 2A there is illustrated a first region 207 of the substrate 101 and a second region 209 of the substrate 101, there is in FIG. 2B also illustrated a third region 211 of the substrate 101 and a fourth region 213 of the substrate 101.

The ILD layer 201 may comprise a material such as boron phosphorous silicate glass (BPSG), although any suitable dielectrics may be used. The ILD layer 201 may be formed using a process such as PECVD, although other processes, such as LPCVD, may alternatively be used. The ILD layer 201 may be formed to a thickness of between about 100 Å and about 3,000 Å. Once formed, the ILD layer 201 may be planarized with the first spacers 113 (not separately illustrated in FIGS. 2A-2B for clarity) using, e.g., a planarization process such as chemical mechanical polishing process, although any suitable process may be utilized.

FIGS. 2A-2B also illustrate a removal of the material of the dummy gate electrode 111 and the dummy gate dielectric 109. In an embodiment the dummy gate electrode 111 and the dummy gate dielectric 109 may be removed using, e.g., one or more wet or dry etching processes that utilize etchants that are selective to the material of the dummy gate electrode 111 and the dummy gate dielectric 109. However, any suitable removal process or processes may be utilized.

Once the dummy gate electrode 111 and the dummy gate dielectric 109 have been removed, a process to replace the dummy gate electrode 111 and the dummy gate dielectric 109 may be begun by depositing a series of layers. In an embodiment the series of layers may include an optional interfacial layer (not separately illustrated), a first dielectric material 203, and a first p-metal work function layer 205.

Optionally, the interfacial layer may be formed prior to the formation of the first dielectric material 203. In an embodiment the interfacial layer may be a material such as silicon dioxide formed through a process such as in situ steam generation (ISSG). In another embodiment the interfacial layer may be a high-k material such as $HfO_2$, HfSiO, HfSiON, HfTaO, HfTiO, HfZrO, LaO, ZrO, $Ta_2O_5$, combinations of these, or the like, to a first thickness of between about 5 Å and about 20 Å, such as about 10 Å. However, any suitable material or process of formation may be utilized.

Once the interfacial layer is formed, the first dielectric material 203 may be formed over the interfacial layer. In an embodiment the first dielectric material 203 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 203 may be deposited to a second thickness of between about 5 Å and about 200 Å, although any suitable material and thickness may be utilized.

The first p-metal work function layer 205 may be formed adjacent to the first dielectric material 203. In an embodiment the first p-metal work function layer 205 may be formed from a metallic material such as titanium nitride doped with silicon (TSN), TiN, Ti, TiAlN, TaC, TaCN, TaSiN, TaSi$_2$, NiSi$_2$, Mn, Zr, ZrSi$_2$, TaN, Ru, Al, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 205 may be deposited using a deposition process such as atomic layer deposition, chemical vapor deposition, sputtering, or the like, to a fourth thickness of between about 5 Å and about 200 Å, although any suitable deposition process or thickness may be used.

FIGS. 2A-2B additionally illustrate initial steps in a process to remove the first p-metal work function layer 205 from the first region 207, the third region 211, and the fourth region 213, but not from the second region 209. In an embodiment the removal may be initiated by placing a first photoresist 215 over the second region 209. The first photoresist 215 may be a tri-layer photoresist with a bottom anti-reflective coating (BARC) layer 217, an intermediate mask layer 219, and a top photosensitive layer 221. The BARC layer 217 is applied in preparation for an application of the top photosensitive layer 221. The BARC layer 217, as its name suggests, works to prevent the uncontrolled and undesired reflection of energy (e.g., light) back into the overlying top photosensitive layer 221 during an exposure of the top photosensitive layer 221, thereby preventing the reflecting light from causing reactions in an undesired region of the top photosensitive layer 221. Additionally, the BARC layer 217 may be used to provide a planar surface, helping to reduce the negative effects of the energy impinging at an angle.

The intermediate mask layer 219 may be placed over the BARC layer 217. In an embodiment the intermediate mask layer 219 is a hard mask material such as silicon nitride, oxides, oxynitrides, silicon carbide, combinations of these, or the like. The hard mask material for the intermediate mask layer 219 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combinations are fully intended to be included within the scope of the embodiments. The intermediate mask layer 219 may be formed to a thickness of between about 100 Å and about 800 Å, such as about 300 Å.

In an embodiment the top photosensitive layer 221 is applied over the intermediate mask layer 219 using, e.g., a spin-on process, and includes a photoresist polymer resin along with one or more photoactive compounds (PACs) in a photoresist solvent. The PACs will adsorb the patterned light source and generate a reactant in those portions of the top photosensitive layer 221 that are exposed, thereby causing a subsequent reaction with the photoresist polymer resin that can be developed in order to replicate the patterned energy source within the top photosensitive layer 221.

Once each of the BARC layer 217, the intermediate mask layer 219, and the top photosensitive layer 221 have been applied, the top photosensitive layer 221 is exposed to a patterned energy source (e.g., light) and developed in order to cover the second region 209 without covering the first region 207, the third region 211, and the fourth region 213. In an embodiment the top photosensitive layer 221 is patterned to have a width of between about 60 nm and about 160 nm, such as about 120 nm. However, any suitable width may be utilized.

Figure 3A:
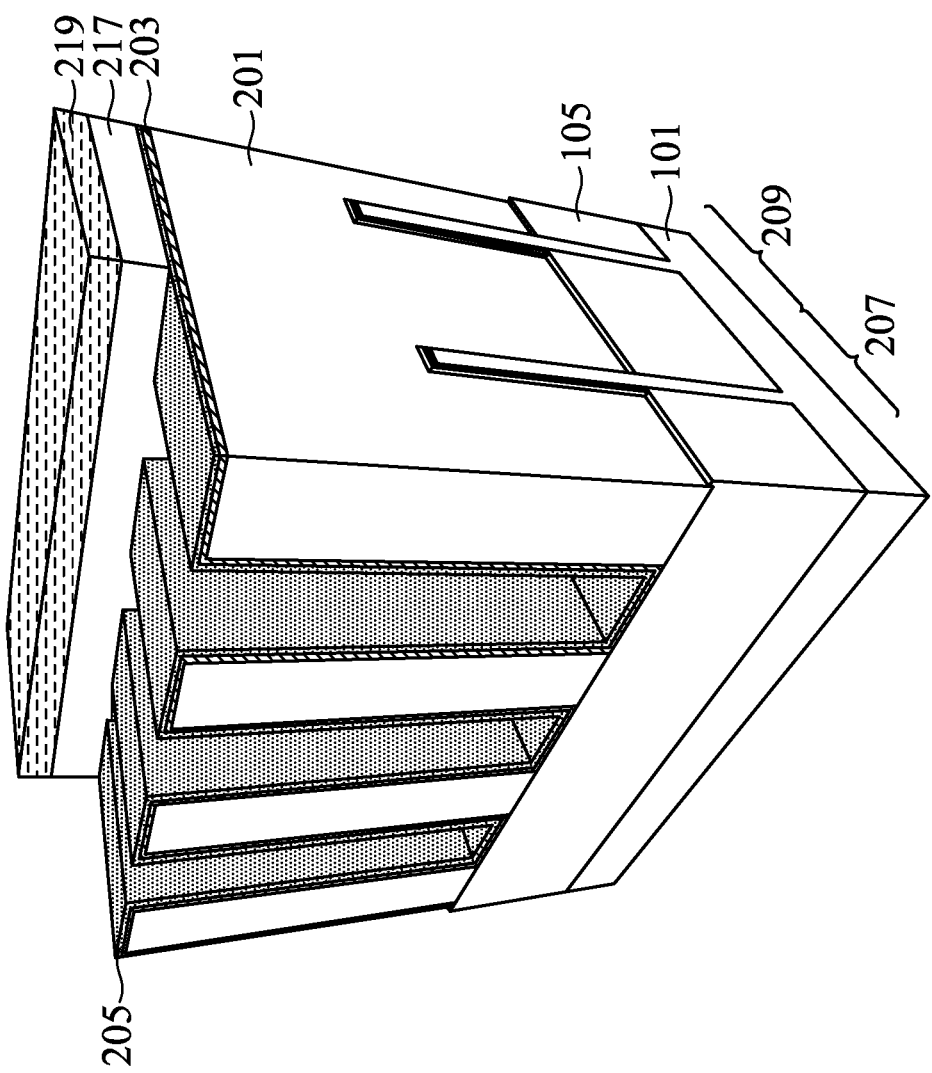
FIGS. 3A-3B illustrate a patterning of a bottom anti-reflective layer, in accordance with some embodiments.
Figure 3B:
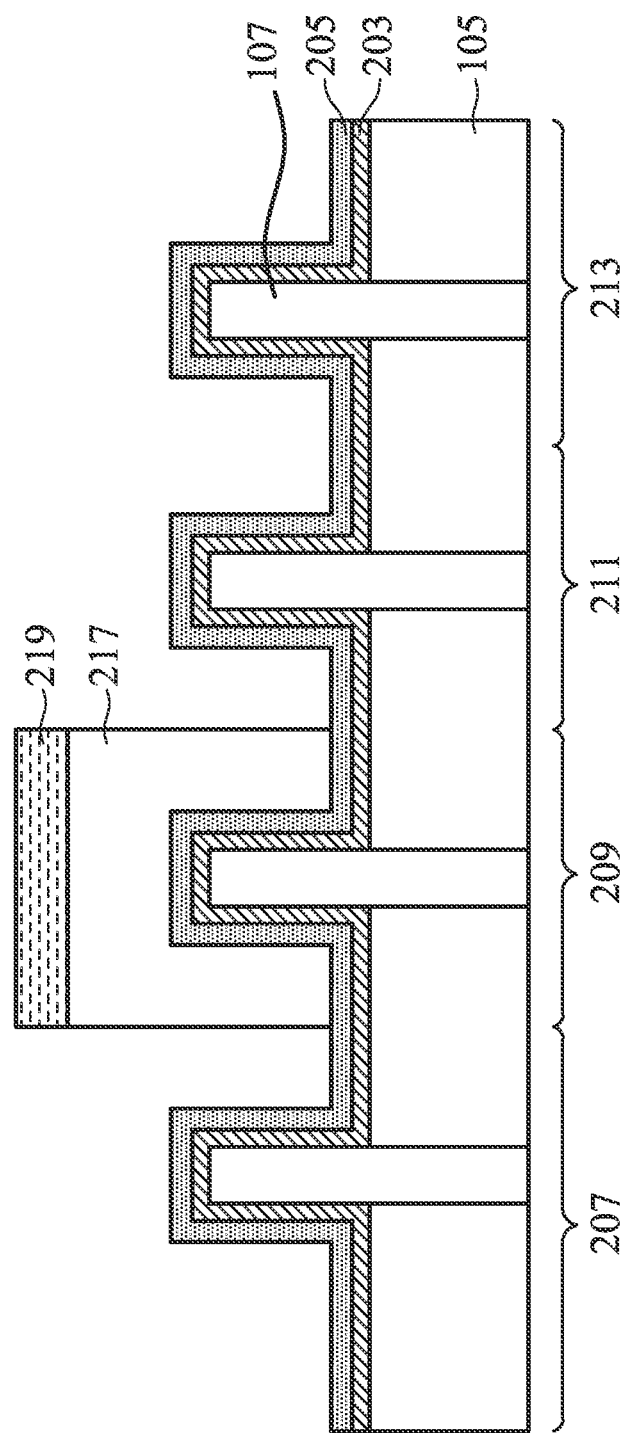

FIGS. 3A-3B illustrate that, once the top photosensitive layer 221 has been patterned, the top photosensitive layer 221 may then be used as a mask to extend the pattern into the intermediate mask layer 219. In an embodiment the pattern of the top photosensitive layer 221 may be extended using, for example, one or more etching processes, such as one or more reactive ion etches. However, any suitable method may be utilized to extend the pattern of the top photosensitive layer 221.

Additionally, once the intermediate mask layer 219 has been patterned, the pattern of the intermediate mask layer 219 may be used as another mask in order to extend the pattern into the BARC layer 217. In an embodiment the pattern of the intermediate mask layer 219 may be extended using, for example, one or more etching processes, such as one or more reactive ion etches. However, any suitable method may be utilized to extend the pattern of the intermediate mask layer 219.

FIGS. 3A-3B additionally illustrate that, during the patterning of either the intermediate mask layer 219 and/or the BARC layer 217, the top photosensitive layer 221 may be consumed. For example, the etchants utilized for the patterning of the intermediate mask layer 219 and/or the BARC layer 217 may also etch the top photosensitive layer 221, although at a smaller rate. As such, the top photosensitive layer 221 is still used as a mask, although by the end of the patterning of the BARC layer 217 the top photosensitive layer 221 may be fully removed. If not, an optional ashing process may be utilized to remove the top photosensitive layer 221. However, any other suitable process may be utilized in order to remove the top photosensitive layer 221.

Figure 4A:
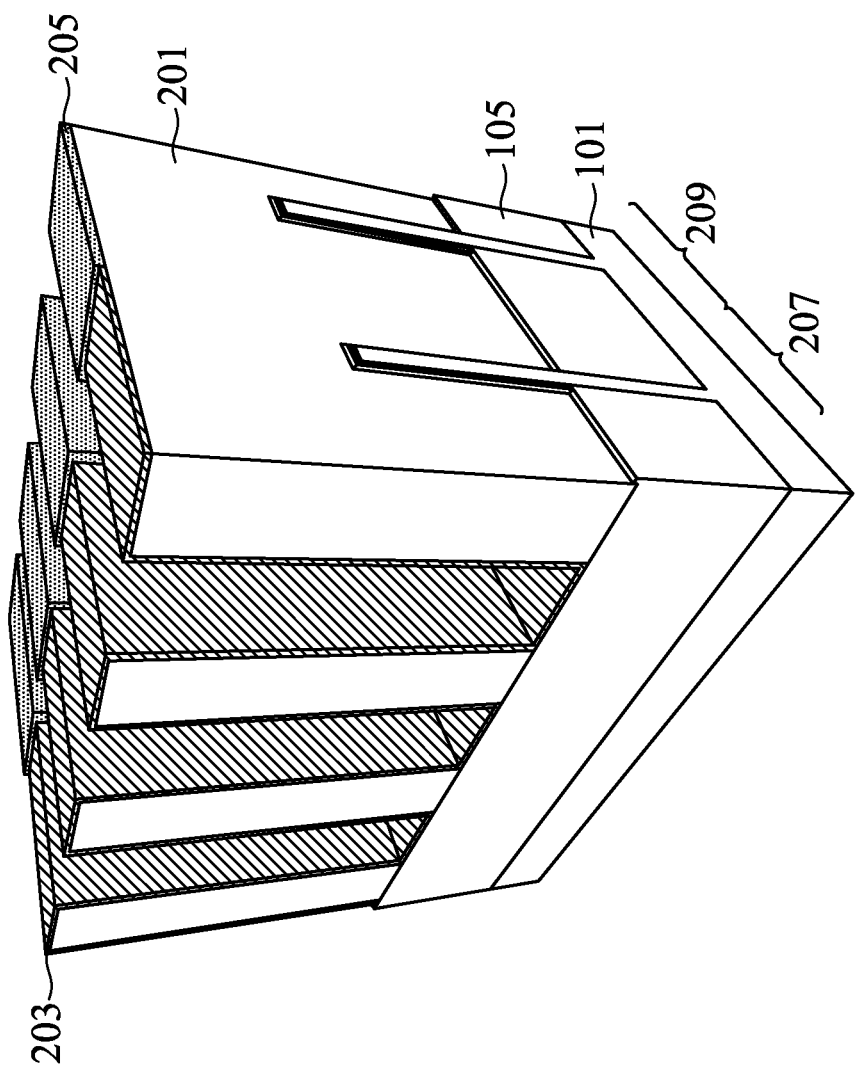
FIGS. 4A-4B illustrate an etching process, in accordance with some embodiments.
Figure 4B:
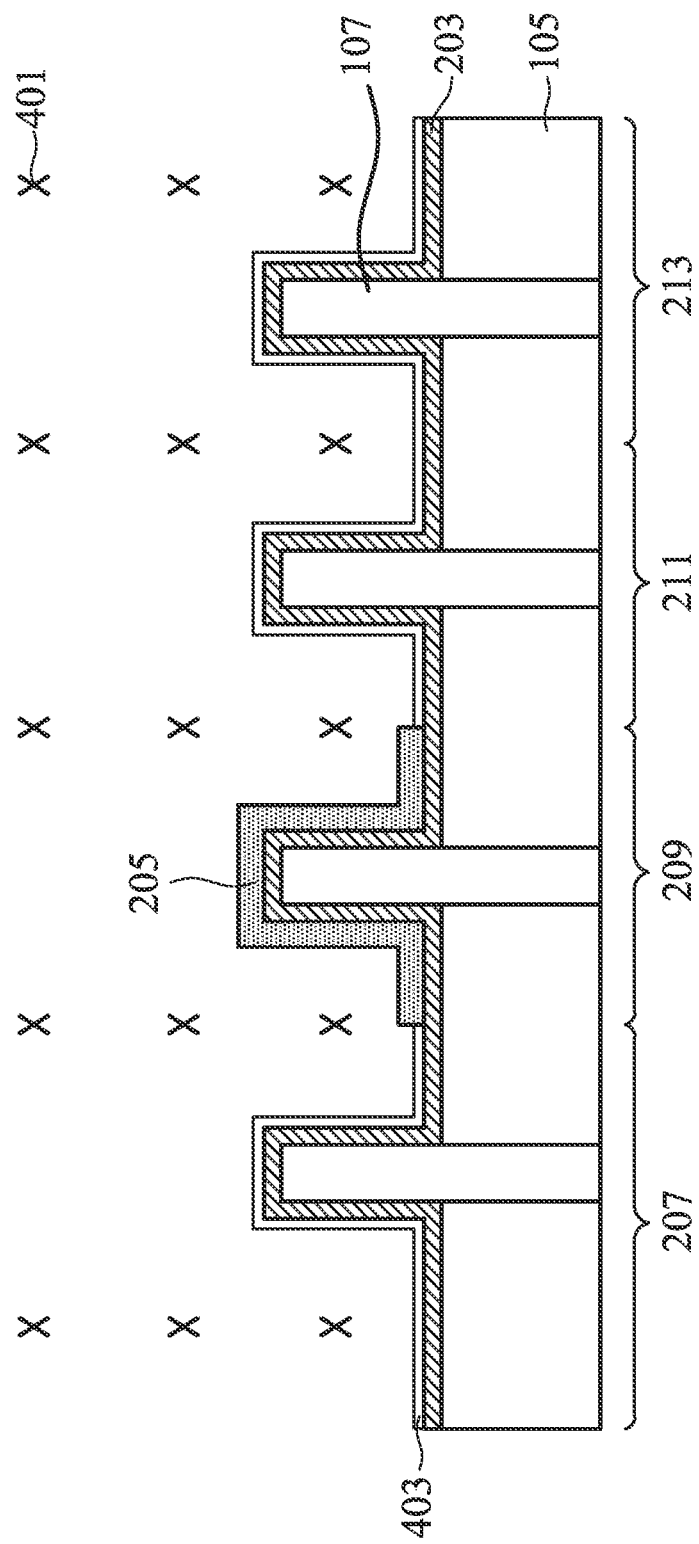

FIGS. 4A-4B illustrate that, once the first p-metal work function layer 205 has been exposed in the second region 209, the first p-metal work function layer 205 in the first region 207, the third region 211, and the fourth region 213 may be removed through an application of a wet etching solution (represented in FIG. 4B by the "X"s labeled 401). Optionally, prior to the removal of the first p-metal work function layer 205, the intermediate mask layer 219 may be removed. In an embodiment the intermediate mask layer 219 may be removed using a suitable etching process, such as a wet etching process which utilizes an etchant that is selective to the material of the intermediate mask layer 219. However, any suitable removal process may be utilized to remove the intermediate mask layer 219.

In an embodiment the first p-metal work function layer 205 may be removed in the first region 207, the third region 211, and the fourth region 213 utilizing one or more etching process, such as a wet etching process or a dry etching process that is selective to the material of the first p-metal work function layer 205 (e.g., titanium nitride) and which stops without significantly removing or damaging the material of the underlying materials (e.g., the first dielectric material 203).

In an embodiment in which the first p-metal work function layer 205 is removed using a wet etching process, the wet etching solution 401 may be utilized which not only removes the first p-metal work function layer 205, but also helps to inhibit any undesirable etching and removal of the underlying first dielectric material 203. In a particular embodiment the wet etching solution 401 comprises a metal etchant, an oxidizer, an inhibitor, and a solvent.

The metal etchant may be an etchant that can be used to react with and remove the exposed portions of the first p-metal work function layer 205. As such, while the precise metal etchant is dependent at least in part on the material chosen for the first p-metal work function layer 205, in an embodiment in which the first p-metal work function layer 205 is titanium nitride doped with silicon (TSN), the metal etchant may be an etchant such as tetramethylammonium hydroxide (TMAH), ammonium hydroxide (NH$_4$OH), tetrabutylammonium hydroxide (TBAH), an hydroxy amine, combinations of these, or the like. However, any suitable metal etchant may also be utilized.

Optionally, an oxidant may also be added into the wet etching solution 401 in order to modify the etching characteristics of the wet etching process such as by accelerating the etching of the material of the first p-metal work function layer 205. In some embodiments the oxidant may comprise a chemical such as hydrogen peroxide (H$_2$O$_2$), nitric acid (HNO$_3$), chloric acid (HClO$_3$), perchloric acid (HClO$_4$), combinations of these, or the like. However, any suitable oxidant may be utilized.

However, in order to mitigate or reduce the damage that would otherwise be caused to the first dielectric material 203 by the metal etchant and the oxidizer, the inhibitor is added into the wet etching solution 401. In some embodiments the inhibitor is an organic inhibitor for the high-k dielectric layer which helps to protect the underlying first dielectric material 203 by reacting with or being adsorbed by the exposed surfaces of the first dielectric material 203 once the surfaces of the first dielectric material 203 have been exposed by the removal of the first p-metal work function layer 205.

Then, once the inhibitor has reacted with or been adsorbed by the surface of the first dielectric material 203, the inhibitor is in place on the surface of the first dielectric material 203 and helps to prevent damage to the underlying first dielectric material 203 in multiple ways. For example, with the presence of the inhibitor on the surface of the first dielectric material 203, steric forces caused by the size of the molecules of the inhibitor help to prevent the metal etchant or the oxidizer from making contact with the material of the underlying first dielectric material 203.

In another embodiment, the inhibitor can be chosen to specifically shift the physical properties of the surface of first dielectric material 203 and help prevent reactions with the metal etchant or the oxidizer. For example, in some embodiments in which the pre-reaction surface of the first dielectric material 203 is hydrophilic, the inhibitor may be chosen to react with the surface and change the surface of the first dielectric material 203 from being hydrophilic to being hydrophobic. Such a modification will help to prevent the etchant (which may be hydrophilic) from making contact and reacting with the surface of the first dielectric material 203.

In some embodiments the inhibitor may be an acid such as a phosphoric acid. In specific embodiments the phosphoric acid may have the following structure:

wherein each of R and R' may be an alkyl group, an alkoxy group, an amine group, and ester group, or a phenyl group. In particular embodiments in which the inhibitor is a phosphoric acid, the inhibitor may be di-(2-ethylhexyl)phosphoric acid, dihexylphosphoric acid, ethyl hexadecyl phosphate, n-butyl-octyl-hydrogenphosphate, diisoamylphosphoric acid, ethyl octyl phosphate, combinations of these, or the like. However, any suitable phosphoric acid may be utilized.

In an embodiment, during the etching of the first p-metal work function layer 205, the inhibitor in which the inhibitor is a phosphoric acid will react with not only the surface of the first dielectric material 203 but will also react with the oxidizer (e.g., H$_2$O$_2$). These reactions will result in an R—PO3$^{2-}$ group bonded to the surface of the first dielectric material 203. This group will work to both sterically hinder the reaction of the first dielectric material 203 and will also work to shift the surface of the first dielectric material 203 to be hydrophobic. Both of these work together to reduce or eliminate reactions between the metal etchant and the surface of the first dielectric material 203 and help to reduce or prevent damage to the first dielectric material 203.

In another embodiment the inhibitor may be an acid such as a carboxylic acid. In specific embodiments the carboxylic acid may have the following structure:

R—COOH wherein R may be a C$_2$-C$_8$ carbon chain or a phenyl group. In a particular embodiment in which the inhibitor is a carboxylic acid, the inhibitor may be propanoic acid, butanoic acid, pentanoic acid, hexanoic acid, heptanoic acid, octanoic acid, nonanoic acid, combinations of the like. However, any suitable carboxylic acid may be utilized.

In this embodiment, during the etching of the first p-metal work function layer 205, the inhibitor in which the inhibitor is a carboxylic acid will react with the surface of the first dielectric material 203 once the first dielectric material 203 has been exposed. These reactions will result in an R—COO$^-$ group bonded to the surface of the first dielectric material 203. This group will work to both sterically hinder the reaction of the first dielectric material 203 and will also work to shift the surface of the first dielectric material 203 to be hydrophobic. Both of these work together to reduce or eliminate reactions between the metal etchant and the surface of the first dielectric material 203 and help to reduce or prevent damage to the first dielectric material 203.

In yet another embodiment the inhibitor may be an acid such as an amino acid. In specific embodiments the amino acid may have the following structure:

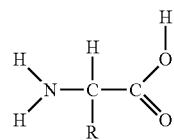

wherein R may be an alkyl group, an amine group, an ester group, or a phenyl group. In a particular embodiment in which the inhibitor is an amino acid, the inhibitor may be glycine, alanine, phenylalanine, tyrosine, glutamate, methionine, cysteine, leucine, combinations of these, or the like. However, any suitable amino acid may be utilized.

In this embodiment, during the etching of the first p-metal work function layer 205, the inhibitor in which the inhibitor is an amino acid will react with the surface of the first dielectric material 203 once the first dielectric material 203 has been exposed. These reactions will result in an R—NH$^-$ group bonded to the surface of the first dielectric material 203. This group will work to both sterically hinder the reaction of the first dielectric material 203 and will also work to shift the surface of the first dielectric material 203 to be hydrophobic. Both of these work together to reduce or eliminate reactions between the metal etchant and the surface of the first dielectric material 203 and help to reduce or prevent damage to the first dielectric material 203.

In yet another embodiment the inhibitor may be a molecule with a hydroxyl group (OH) on it. In specific embodiments the hydroxyl group may have the following structure:

wherein R may be an alkyl group, an alkoxy group, an amine group, an ester group, or a phenyl group. In a particular embodiment in which the inhibitor comprises an OH group, the inhibitor may be ethylene glycol, diethylene glycol, triethylene glycol, ethylene glycol butyl ether, carbitol, combinations of these, or the like. However, any suitable molecule with a hydroxyl group may be utilized.

In this embodiment, during the etching of the first p-metal work function layer 205, the inhibitor in which the inhibitor comprises an OH group will be hydrogen bonded to the surface of the first dielectric material 203 once the first dielectric material 203 has been exposed. These hydrogen bonds will result in an R—O⁻ group bonded to the surface of the first dielectric material 203. This group will work to both sterically hinder the reaction of the first dielectric material 203 and will also work to shift the surface of the first dielectric material 203 to be hydrophobic. Both of these work together to reduce or eliminate reactions between the metal etchant and the surface of the first dielectric material 203 and help to reduce or prevent damage to the first dielectric material 203.

To prepare the wet etching solution 401, each of the metal etchant, the oxidant, and the inhibitor may be placed into a solvent in order to mix the components and provide for a method of transport and dispersal of the wet etching solution 401. In some embodiments, the solvent may be ethylene glycol, diethylene glycol, N-hydroxyethyl-2-pyrrolidone (HEP), dimethyl sulfoxide (DMOS), sulfolane, combinations of these, or the like. However, any suitable solvent may be utilized.

The individual components of the wet etching solution 401 are mixed to a concentration sufficient to remove the first p-metal work function layer 205 without overly etching or damaging the underlying first dielectric material 203. In an embodiment the metal etchant may be mixed to a concentration of between about 2%-vol and about 10%-vol, such as about 4.5%-vol. Additionally, the oxidant may be mixed to a concentration of between about 5%-vol and about 20%-vol, such as about 12%-vol. Finally, the inhibitor may be mixed to a non-zero concentration of less than about 5%-vol, such as 0.5%-vol. By placing all of these components (and any other desired components) into the solvent, the solvent may have a concentration of between about 30%-vol and about 90%-vol, such as about 75%-vol. If the concentrations for the metal etchant and the oxidant are over these percentages, then undesired loss of the first dielectric material 203 can occur. Additionally, if the inhibitor exceeds 5%-vol, then the etching rate of the first p-metal work function layer 205 can be undesirably inhibited. However, any suitable concentrations may be utilized.

Once the wet etching solution 401 has been prepared, the wet etching solution 401 may be applied to the first p-metal work function layer 205 to begin etching away the first p-metal work function layer 205. In an embodiment the wet etching solution 401 may be applied to the first p-metal work function layer 205 using a dip method. However, any suitable process of contacting the wet etching solution 401 with the material of the first p-metal work function layer 205, such as puddle processes, spray-on processes, combinations of these, or the like, may be utilized.

Additionally, the wet etching process utilizing the wet etching solution 401 may be performed at a temperature of between about 25° C. and about 70° C., such as about 45° C. Further, the wet etching process may be continued until the material of the first p-metal work function layer 205 has been removed and the first dielectric layer 203 has been exposed, such as between about 30 seconds and about 360 seconds, such as about 120 seconds. However, any suitable temperature and time may be utilized.

In some embodiments the process time may be extended to provide an overetch to ensure that the first p-metal work function layer 205 has been removed. In these embodiments there may be an overetching ratio between about 100% to about 300%. In such embodiments in which the p-metal etching rate is 20 Å/min, and the first p-metal work function layer 205 is 20 Å, the process time including the overetch of 100% would be about 2 minutes.

However, during the wet etching process, as the first dielectric material 203 becomes exposed, the inhibitor within the wet etching solution 401 will react with the now exposed surface. Further, as the inhibitor reacts and places individual molecules onto the surface of the first dielectric material 203, a protective layer 403 will be formed over exposed surfaces of the first dielectric material 203. The protective layer 403 will be one monolayer thick, and in some embodiments will shift the surface of the first dielectric material 203 from being hydrophilic to being hydrophobic.

In some embodiments the protective layer 403 will incorporate a portion of the inhibitor from the wet etching solution 401. For example, in an embodiment in which the inhibitor is a phosphoric acid, the protective layer 403 will incorporate a portion of the phosphoric acid, such as phosphorous, while in an embodiment in which the inhibitor is a carboxylic acid, the protective layer 403 will incorporate a portion of the carboxylic acid, such as carbon. Similarly, in an embodiment in which the inhibitor is an amino acid, the protective layer 403 will incorporate a portion of the amino acid, such as nitrogen, while in an embodiment in which the inhibitor comprises a hydroxyl group, the protective layer 403 will incorporate a portion of the hydroxyl group, such as oxygen.

By forming the protective layer 403, the inhibitor within the wet etching solution 401 will work to increase the selectivity between the first p-metal work function layer 205 and the first dielectric material 203. In some embodiments the selectivity between the first p-metal work function layer 205 and the first dielectric material 203 may be between about 1:1 and about 1:100, such as about 1:20. Such an increase in selectivity reduces damage to the first dielectric material 203 that may cause undesired shifts in the threshold voltage, the metal gate leakage, or overall reliability of the devices.

Once the first p-metal work function layer 205 has been etched while the first dielectric layer 203 has been protected, the wet etching solution 401 may be removed from the first dielectric material 203 and the protective layer 403 may be removed. In an embodiment the protective layer 403 may be removed using a rinse solution, such as a water or solvent rinse; a cleaning solution, such as a deionized water or IPA cleaning solution; or even a plasma treatment, such as an argon plasma treatment. However, any suitable method of removing the protective layer 403 may be utilized.

Figure 5A:
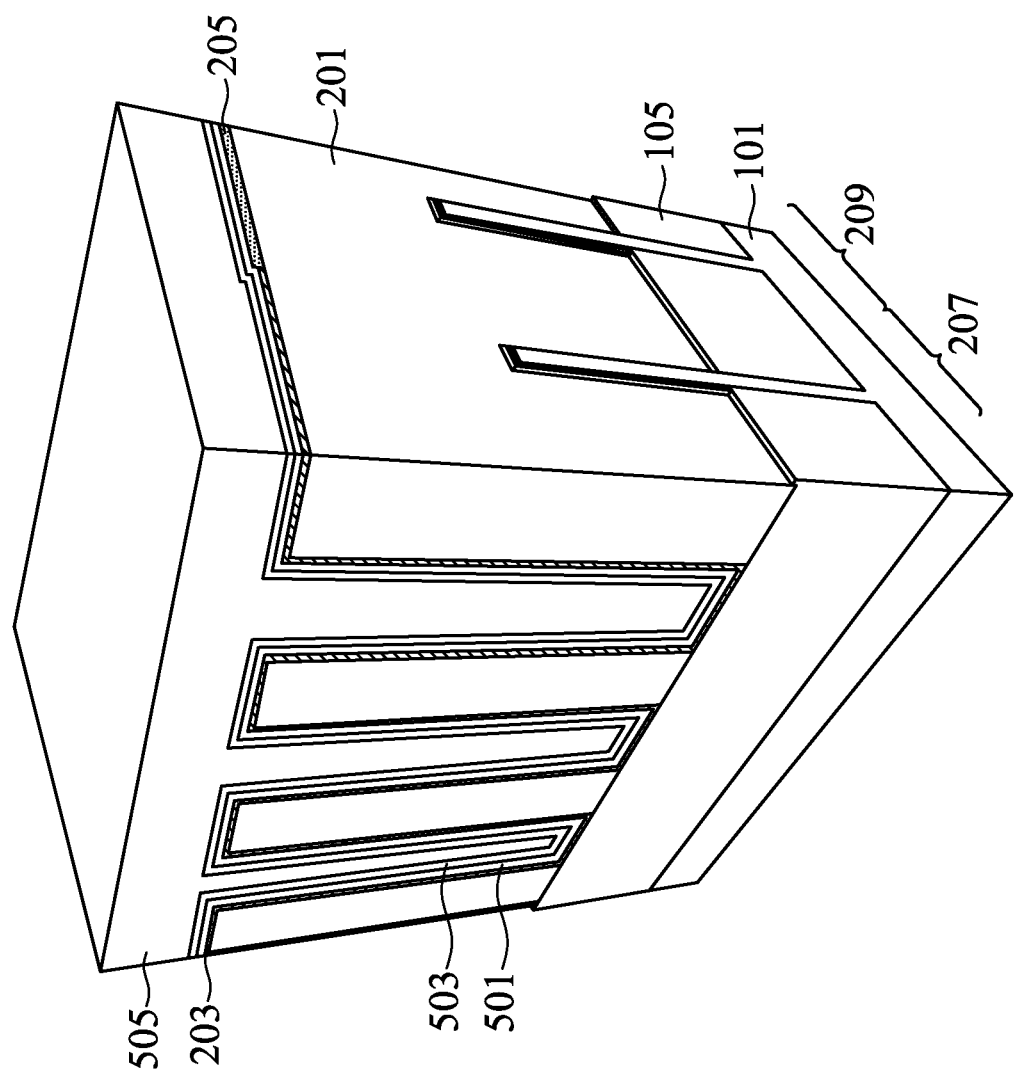
FIGS. 5A-5B illustrate formation of a gate structure, in accordance with some embodiments.
Figure 5B:
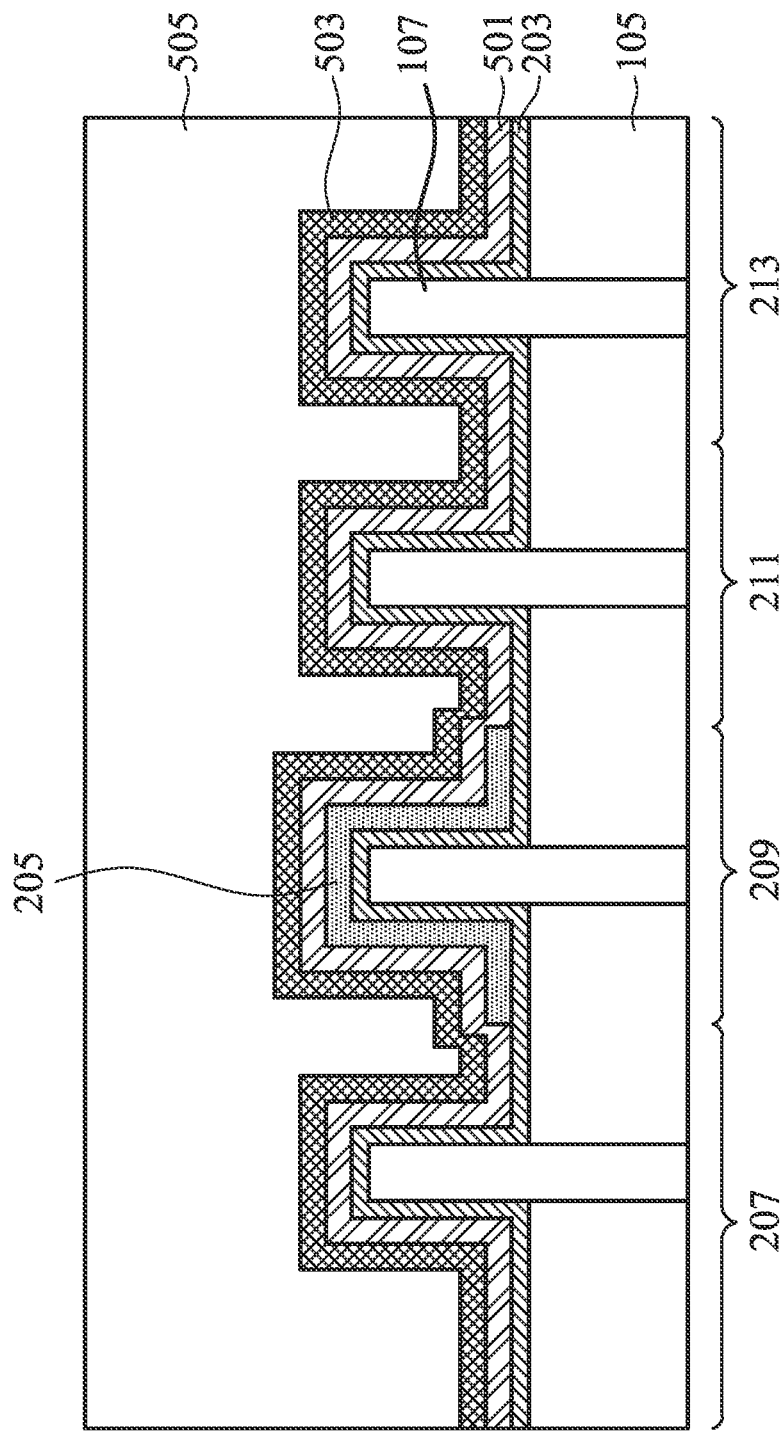

FIGS. 5A-5B illustrate that, once the first p-metal work function layer 205 has been removed, the BARC layer 217 may be removed and a first n-metal work function layer 501, a glue layer 503, and a fill material 505 may be deposited over the first region 207, the second region 209, the third region 211, and the fourth region 213. In an embodiment the BARC layer 217 may be removed using a process such as ashing, whereby a temperature of the BARC layer 217 is increased until the BARC layer 217 experiences a thermal decomposition and can then be removed. However, any suitable method may be utilized to remove the BARC layer 217.

Once the BARC layer 217 has been removed, the first n-metal work function layer 501 may be formed. In an embodiment the first n-metal work function layer 501 may be a material such as Ti, Ag, Al, TaAl, TaAlC, TiAlN, TaC, TaCN, TaSiN, Mn, Zr, other suitable n-type work function materials, or combinations thereof. For example, the first n-metal work function layer 501 may be deposited utilizing an atomic layer deposition (ALD) process, CVD process, or the like, to a sixth thickness of between about 20 Å and about 50 Å, such as about 30 Å. However, any suitable materials and processes may be utilized to form the first n-metal work function layer 501.

Once the first n-metal work function layer 501 has been formed, the glue layer 503 may formed in order to help adhere the overlying fill material 505 with the underlying first n-metal work function layer 501 as well as provide a nucleation layer for the formation of the fill material 505. In an embodiment the glue layer 503 may be a material such as titanium nitride or else may be a material similar to the first n-metal work function layer 501 and may be formed using a similar process such as ALD to a seventh thickness of between about 10 Å and about 100 Å, such as about 50 Å. However, any suitable materials and processes may be utilized.

Once the glue layer 503 has been formed, the fill material 505 is deposited to fill a remainder of the opening using the glue layer 503. In an embodiment the fill material 505 may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 505 may be deposited to a thickness of between about 1000 Å and about 2000 Å, such as about 1500 Å. However, any suitable material may be utilized.

Figure 6A:
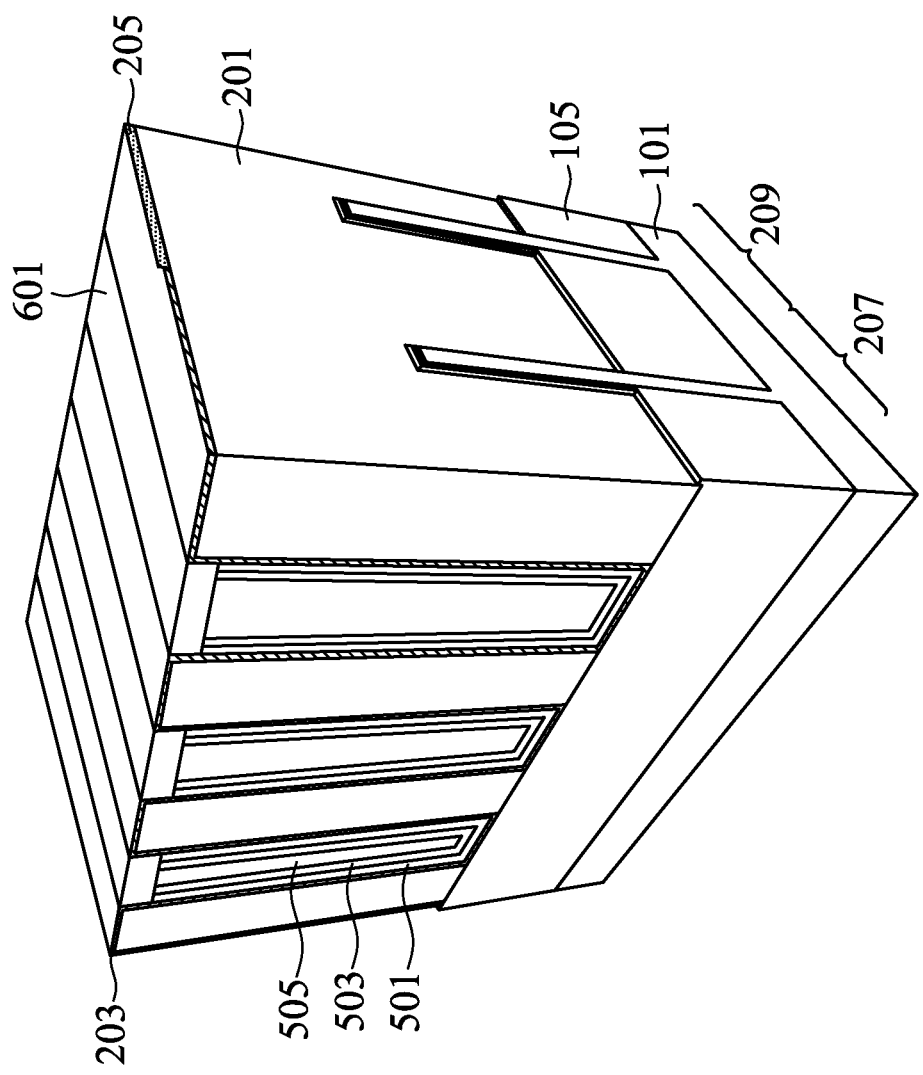
FIGS. 6A-6B illustrate formation of a capping layer, in accordance with some embodiments.
Figure 6B:
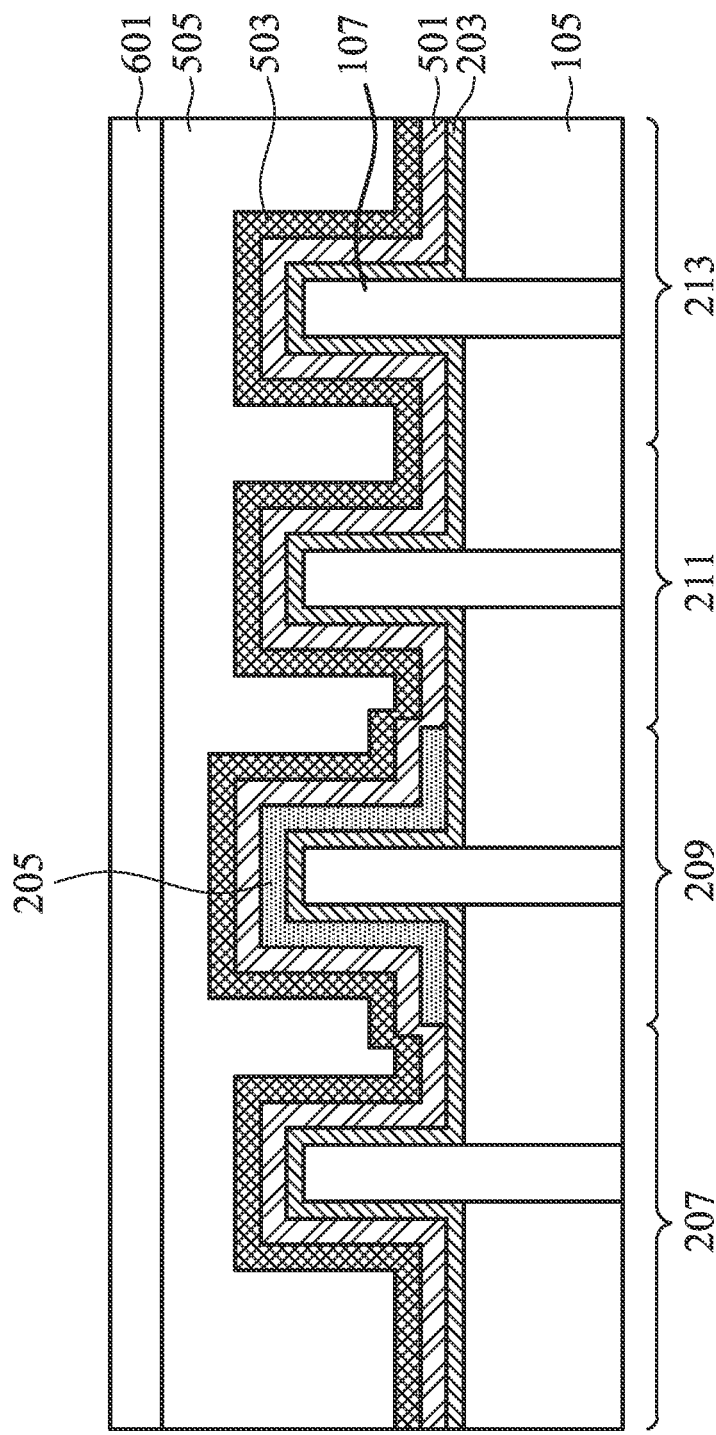

FIGS. 6A-6B illustrate that, after the fill material 505 has been deposited to fill and overfill the opening, the materials within each of the openings of the first region 207, the second region 209, the third region 211, and the fourth region 213 may be planarized. In an embodiment the materials may be planarized with the first spacers 113 using, e.g., a chemical mechanical polishing process, although any suitable process, such as grinding or etching, may be utilized.

After the materials have been formed and planarized, the materials may be recessed and capped with a capping layer 601. In an embodiment the materials may be recessed using, e.g., a wet or dry etching process that utilizes etchants selective to the materials. In an embodiment the materials may be recessed a distance of between about 5 nm and about 150 nm, such as about 120 nm. However, any suitable process and distance may be utilized.

Once the materials have been recessed, the capping layer 601 may be deposited and planarized with the first spacers 113. In an embodiment the capping layer 601 is a material such as SiN, SiON, SiCON, SiC, SiOC, combinations of these, or the like, deposited using a deposition process such as atomic layer deposition, chemical vapor deposition, sputtering, or the like. The capping layer 601 may be deposited to a thickness of between about 5 Å and about 200 Å, and then planarized using a planarization process such as chemical mechanical polishing such that the capping layer 601 is planar with the first spacers 113.

By utilizing the inhibitor within the wet etching solution 401 to increase the selectivity between the high-k dielectric material 203 and the first p-metal work function layer 205, the high-k dielectric material 203 can be protected during the etching process. In some embodiments the damage done by the wet etching process can be improved greater than 60%. Such improvements help to lead towards a more robust process, and also help to prevent any undesired threshold voltage shifts, metal gate leakage, and reliability issues as the manufacturing processes get smaller and smaller, such as getting to five nanometer process nodes and below.

In an embodiment a method of manufacturing a semiconductor device includes: forming a p-metal work function layer over a high-k dielectric layer; and applying a wet etching solution to the p-metal work function layer to remove a portion of the p-metal work function layer, the wet etching solution including: a metal etchant; an inhibitor for the high-k dielectric layer; and a solvent. In an embodiment the high-k dielectric layer is hafnium oxide. In an embodiment the inhibitor is a phosphoric acid. In an embodiment the inhibitor is a carboxylic acid. In an embodiment the inhibitor is an amino acid. In an embodiment the inhibitor comprises a hydroxyl group. In an embodiment the method further includes forming a protective layer on an exposed surface of the high-k dielectric layer after the high-k dielectric layer has been exposed.

In another embodiment, a method of manufacturing a semiconductor device includes: depositing a first p-work function layer onto a high-k dielectric layer; and etching the first p-work function layer with a wet etching solution to expose a first portion of a high-k dielectric layer, wherein the high-k dielectric layer reacts with the wet etching solution to form a protective layer on the high-k dielectric layer. In an embodiment the protective layer comprises phosphorous, nitrogen, or carbon. In an embodiment the wet etching solution includes: a solvent; a first metal etchant; an oxidizer; and an inhibitor. In an embodiment the inhibitor comprises one or more of a phosphoric acid, a carboxylic acid, or an amino acid. In an embodiment the protective layer forms a hydrophobic surface. In an embodiment the high-k dielectric layer comprises hafnium oxide and the first p-work function layer comprises titanium nitride. In an embodiment a selectivity of the wet etching solution between the titanium nitride and the high-k dielectric layer is at least 100:1.

In yet another embodiment, an etching solution includes: a solvent; a first metal etchant; an oxidizer; and an inhibitor comprising one or more of a phosphoric acid, a carboxylic acid, or an amino acid. In an embodiment the inhibitor comprises di-(2-ethylhexyl)phosphoric acid. In an embodiment the inhibitor comprises the carboxylic acid. In an embodiment the inhibitor comprises glycine. In an embodiment the inhibitor has a concentration of less than about 5%. In an embodiment the etching solution has a selectivity between titanium nitride and hafnium oxide of at least 100:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a p-metal work function layer over a dielectric layer; and
   applying a wet etching solution to the p-metal work function layer to remove a portion of the p-metal work function layer, wherein applying the wet etching solution forms a protective layer on an exposed surface of the dielectric layer after the portion of the p-metal work function layer has been removed, the wet etching solution comprising:
   a metal etchant;
   an inhibitor for the dielectric layer; and
   a solvent.

2. The method of claim 1, wherein the dielectric layer is hafnium oxide.

3. The method of claim 1, wherein the inhibitor is a phosphoric acid.

4. The method of claim 1, wherein the inhibitor is a carboxylic acid.

5. The method of claim 1, wherein the inhibitor is an amino acid.

6. The method of claim 1, wherein the inhibitor comprises a hydroxyl group.

7. The method of claim 1, further comprising removing the protective layer.

8. A method of manufacturing a semiconductor device, the method comprising:
   depositing a first p-work function layer onto a high-k dielectric layer; and
   etching the first p-work function layer with a wet etching solution to expose a first portion of the high-k dielectric layer, wherein the wet etching solution comprises an inhibitor for the high-k dielectric layer, wherein the high-k dielectric layer reacts with the wet etching solution to form a protective layer on the high-k dielectric layer.

9. The method of claim 8, wherein the protective layer comprises phosphorous, nitrogen, or carbon.

10. The method of claim 8, wherein the wet etching solution further comprises:
    a solvent;
    a first metal etchant; and
    an oxidizer.

11. The method of claim 8, wherein the inhibitor comprises one or more of a phosphoric acid, a carboxylic acid, or an amino acid.

12. The method of claim 8, wherein the protective layer forms a hydrophobic surface.

13. The method of claim 8, wherein the high-k dielectric layer comprises hafnium oxide and the first p-work function layer comprises titanium nitride.

14. The method of claim 13, wherein a selectivity of the wet etching solution between the titanium nitride and the high-k dielectric layer is at least 100:1.

15. A method of manufacturing a semiconductor device, the method comprising:
    dispensing an etching solution over a p-metal work function material, the p-metal work function material being on a dielectric layer, wherein dispensing the etching solution etches the p-metal work function material to expose a portion of the dielectric layer, the etching solution forming a protective layer on the portion of the dielectric layer, the etching solution comprising:
    a solvent;
    a first metal etchant;
    an oxidizer; and
    an inhibitor comprising one or more of a phosphoric acid, a carboxylic acid, or an amino acid, the inhibitor being for the dielectric layer.

16. The method of claim 15, wherein the inhibitor comprises di-(2-ethylhexyl)phosphoric acid.

17. The method of claim 15, wherein the inhibitor comprises the carboxylic acid.

18. The method of claim 15, wherein the inhibitor comprises glycine.

19. The method of claim 15, wherein the inhibitor has a concentration of less than about 5%-volume.

20. The method of claim 15, wherein the etching solution has a selectivity between titanium nitride and hafnium oxide of at least 100.

* * * * *